United States Patent
Strauss et al.

(10) Patent No.: US 9,786,386 B2
(45) Date of Patent: Oct. 10, 2017

(54) DYNAMIC APPROXIMATE STORAGE FOR CUSTOM APPLICATIONS

(71) Applicant: Microsoft Technology Licensing, LLC, Redmond, WA (US)

(72) Inventors: Karin Strauss, Seattle, WA (US); Luis Henrique Ceze, Seattle, WA (US); Henrique S. Malvar, Redmond, WA (US); Qing Guo, Rochester, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/633,787

(22) Filed: Feb. 27, 2015

(65) Prior Publication Data
US 2016/0254063 A1 Sep. 1, 2016

(51) Int. Cl.
*G11C 29/50* (2006.01)
*G06F 11/10* (2006.01)
*G11C 29/52* (2006.01)
*G11C 7/10* (2006.01)

(52) U.S. Cl.
CPC .... *G11C 29/50004* (2013.01); *G06F 11/1048* (2013.01); *G06F 11/1072* (2013.01); *G11C 7/1006* (2013.01); *G11C 29/52* (2013.01); *G11C 2029/5004* (2013.01); *G11C 2211/5641* (2013.01)

(58) Field of Classification Search
CPC .............. G11C 29/50004; G11C 29/52; G11C 2029/5004; G11C 7/1006; G11C 2211/5641; G06F 11/1048; G06F 11/1072
USPC ....................................................... 714/721
See application file for complete search history.

(56) References Cited

U.S. PATENT DOCUMENTS

| | | |
|---|---|---|
| 6,012,160 A | 1/2000 | Dent |
| 6,466,476 B1 | 10/2002 | Wong et al. |
| 6,558,967 B1 | 5/2003 | Wong |
| 6,643,169 B2 | 11/2003 | Rudelic et al. |
| 6,879,521 B2 | 4/2005 | Furuyama |

(Continued)

FOREIGN PATENT DOCUMENTS

WO 2005089178 A2 9/2005

OTHER PUBLICATIONS

Handling PCM Resistance Drift with Device, Circuit, Architecture, and System Solutions Manu Awasthiy, Manjunath Shevgoory, Kshitij Sudany, Rajeev Balasubramoniany, Bipin Rajendranz, Viji Srinivasanz University of Utah, IBM T.J. Watson Research Center Mar. 2, 2011.*

(Continued)

*Primary Examiner* — Cynthia Britt
(74) *Attorney, Agent, or Firm* — Talem IP Law, LLP

(57) ABSTRACT

A memory chip for dynamic approximate storage includes an array of memory cells associated with at least two regions. The chip further includes at least one threshold register for storing values for thresholds for memory cells corresponding to each of the at least two regions; and control logic to programmatically adjust the values for the thresholds for the memory cells. A method of controlling a storage device for dynamic approximate storage includes modifying at least one value stored in a threshold register and associated with at least one cell in a region of a memory comprising at least two regions to apply a biasing for the at least one cell, wherein the biasing adjusts ranges for values in a cell.

20 Claims, 6 Drawing Sheets

(56) References Cited

U.S. PATENT DOCUMENTS

| | | | |
|---|---|---|---|
| 7,366,013 B2* | 4/2008 | Roohparvar | G11C 11/5628 365/185.03 |
| 7,460,398 B1* | 12/2008 | Roohparvar | G11C 11/5628 365/185.03 |
| 7,660,154 B2 | 2/2010 | Wang | |
| 7,870,457 B2* | 1/2011 | Mokhlesi | G11C 16/3418 714/752 |
| 8,140,746 B2 | 3/2012 | Trichina et al. | |
| 8,239,735 B2 | 8/2012 | Shalvi et al. | |
| 8,259,497 B2 | 9/2012 | Shalvi et al. | |
| 8,356,231 B2* | 1/2013 | Cornwell | G11C 11/5628 365/185.01 |
| 8,627,165 B2 | 1/2014 | Liikanen et al. | |
| 8,656,258 B2 | 2/2014 | Kim et al. | |
| 8,665,642 B2 | 3/2014 | Rychlik et al. | |
| 8,670,274 B2 | 3/2014 | Winter et al. | |
| 8,699,266 B2 | 4/2014 | Bandic et al. | |
| 8,806,297 B2* | 8/2014 | D'Abreu | G06F 11/1012 365/185.09 |
| 8,861,270 B2 | 10/2014 | Strauss et al. | |
| 8,891,303 B1 | 11/2014 | Higgins et al. | |
| 2007/0174740 A1 | 7/2007 | Kanno | |
| 2009/0019321 A1* | 1/2009 | Radke | G11C 11/56 714/54 |
| 2009/0241006 A1 | 9/2009 | Liikanen et al. | |
| 2009/0259799 A1* | 10/2009 | Wong | G06F 12/0207 711/103 |
| 2009/0287969 A1 | 11/2009 | White et al. | |
| 2011/0131444 A1 | 6/2011 | Buch et al. | |
| 2011/0176590 A1 | 7/2011 | Banerjee et al. | |
| 2011/0296274 A1* | 12/2011 | Mittelholzer | G06F 11/1072 714/755 |
| 2012/0144111 A1 | 6/2012 | Weber et al. | |
| 2012/0155174 A1* | 6/2012 | Cornwell | G11C 11/5628 365/185.09 |
| 2012/0243311 A1 | 9/2012 | Chen et al. | |
| 2012/0254693 A1* | 10/2012 | Mittelholzer | H03M 13/251 714/763 |
| 2013/0024605 A1 | 1/2013 | Sharon et al. | |
| 2014/0089561 A1 | 3/2014 | Pangal et al. | |
| 2014/0143780 A1 | 5/2014 | Strauss et al. | |
| 2014/0219001 A1* | 8/2014 | Patapoutian | G11C 13/0002 365/148 |
| 2014/0245108 A1* | 8/2014 | Gaertner | G06F 11/1008 714/773 |
| 2014/0258593 A1 | 9/2014 | Strauss et al. | |

OTHER PUBLICATIONS

A. Ranjan, S. Venkataramani, X. Fong, K. Roy and A. Raghunathan, "Approximate storage for energy efficient spintronic memories," 2015 52nd ACM/EDAC/IEEE Design Automation Conference (DAC), San Francisco, CA, 2015, pp. 1-6.*

Zhou, et al., "Error-Correcting Schemes with Dynamic Thresholds in Nonvolatile Memories", In Proceedings of IEEE International Symposium on Information Theory Proceedings, Jul. 31, 2011, pp. 2109-2113.

Ielmini, et al., "Physical Interpretation, Modeling and Impact on Phase change Memory (PCM) Reliability of Resistance Drift due to Chalcogenide Structural Relaxation", In IEEE International Electron Devices Meeting, Dec. 10, 2007, pp. 939-942.

Li, et al., "Improving Multi-Level NAND Flash Memory Storage Reliability Using Concatenated BCH-TCM Coding", In IEEE Transactions on Very Large Scale Integration (VLSI) Systems, vol. 18, No. 10, Oct. 2010, pp. 1412-1420.

Awasthi, et al., "Efficient Scrub Mechanisms for Error-Prone Emerging Memories", In Proceedings of the IEEE 18th International Symposium on High-Performance Computer Architecture, Feb. 25, 2012, 12 pages.

Azevedoy, et al., "Zombie Memory: Extending Memory Lifetime by Reviving Dead Blocks", In Proceedings of the 40th Annual International Symposium on Computer Architecture, Jun. 23, 2013, 12 pages.

Beaver, et al., "Finding a needle in Haystack: Facebook's photo storage", In Proceedings of the 9th USENIX conference on Operating systems design and implementation Article No. 1-8, Oct. 4, 2010, 14 pages.

Dufaux, et al., "The JPEG XR image coding standard", In IEEE Signal Processing Magazine, vol. 26, No. 6, Nov. 2009, 6 pages.

Gastpar, et al., "Source-channel communication in sensor networks", In Proceedings of the 2nd international conference on Information processing in sensor networks, Apr. 22, 2003, 16 pages.

Holcomb, et al., "Qbf-based synthesis of optimal word-splitting in approximate multi-level storage cells", In Workshop on Approximate Computing Across the System Stack, Mar. 2014, 7 pages.

Ielmini, et al., "Recovery and drift dynamics of resistance and threshold voltages in phase-change memories", In IEEE Transactions on Electron Devices vol. 54, Issue 2, Feb. 2007, 8 pages.

Malvar, Henrique S. "Signal Processing with Lapped Transforms", In Book of Artech House Telecommunications Library, Jan. 1, 1992, 3 pages.

Malvar, Henrique S. "Fast progressive wavelet coding", In Proceedings of the Conference on Data Compression, Mar. 29, 1999, 8 pages.

Malvar, Henrique S. "Fast progressive image coding without wavelets", In Proceeding of Data Compression Conference, Mar. 2000, 10 pages.

Malvar, Henrique S. "Adaptive run-length / golomb-rice encoding of quantized generalized gaussian sources with unknown statistics", In Proceedings of Data Compression Conference, Mar. 2006, 10 pages.

Pennebaker, et al., "JPEG: Still image data compression standard", Published on: Dec. 31, 1992 Available at: http://www.amazon.com/JPEG-Compression-Standard-Multimedia-Standards/dp/0442012721.

Sala, et al., "Dynamic threshold schemes for multi-level non-volatile memories", In IEEE Transactions on Communications, vol. 61, No. 7, Jul. 2013, 11 pages.

Sampson, et al., "Approximate storage in solid-state memories", In Proceedings of the 46th Annual IEEE/ACM International Symposium on Microarchitecture, Dec. 7, 2013, 12 pages.

Schwartz, et al., "Bit-plane encoding: A technique for source encoding", In IEEE Transactions on Aerospace and Electronic Systems, Jul. 1996, 8 pages.

Seong, et al., "Trilevel-cell phase change memory: Toward an efficient and reliable memory system", In Proceedings of the 40th Annual International Symposium on Computer Architecture, Jun. 23, 2013, 12 pages.

Vembu, et al., "The source-channel separation theorem revisited", In IEEE Transactions on Information Theory, vol. 41, No. 1, Jan. 1995, 11 pages.

"International Search Report and Written Opinion Issued in PCT Application No. PCT/US2016/016673", Mailed Date: Apr. 15, 2016, 12 Pages.

"Second Written Opinion Issued in PCT Application No. PCT/US2016/016673", Mailed Date: Feb. 8, 2017, 5 Pages.

"International Preliminary Report on Patentability Issued in PCT Application No. PCT/US2016/016673", dated May 17, 2017, 7 Pages.

* cited by examiner

| Level | Data | $\log R_T$ | | $\log R_B$ | | $\mu(v)$ | | $\sigma(v)$ | Write BER | | Drift BER | |
|---|---|---|---|---|---|---|---|---|---|---|---|---|
| | | a | b | a | b | a | b | | a | b | a | b |
| 0 | 10 | 3.00 | 3.00 | 3.58 | 3.35 | 0.001 | 0.001 | $0.4\mu(v)$ | very low | 2.5E−6 | very low | very low |
| 1 | 11 | 4.17 | 3.60 | 4.75 | 4.27 | 0.027 | 0.012 | | | | very low | very low |
| 2 | 01 | 5.33 | 4.52 | 5.92 | 6.25 | 0.073 | 0.040 | | | | 0.3656 | very low |
| 3 | 00 | 6.50 | 6.50 | — | — | 0.120 | 0.120 | | | | — | — |

FIG. 5A

| Level | Data | $\log R_T$ | | $\log R_B$ | | $\mu(v)$ | | $\sigma(v)$ | Write BER | | Drift BER | |
|---|---|---|---|---|---|---|---|---|---|---|---|---|
| | | a | b | a | b | a | b | | a | b | a | b |
| 0 | 100 | 3.00 | 3.00 | 3.25 | 3.14 | 0.001 | 0.001 | $0.2\mu(v)$ | 5.6E−14 | 5.6E−6 | very low | 0.0005 |
| 1 | 101 | 3.50 | 3.28 | 3.75 | 3.44 | 0.010 | 0.006 | | | | very low | 0.0040 |
| 2 | 111 | 4.00 | 3.58 | 4.25 | 3.75 | 0.020 | 0.012 | | | | 0.6774 | 0.0042 |
| 3 | 110 | 4.50 | 3.90 | 4.75 | 4.12 | 0.040 | 0.018 | | | | 0.9720 | 0.0043 |
| 4 | 010 | 5.00 | 4.28 | 5.25 | 4.62 | 0.060 | 0.031 | | | | 0.9780 | 0.0044 |
| 5 | 011 | 5.50 | 4.78 | 5.75 | 5.33 | 0.080 | 0.051 | | | | 0.9960 | 0.0044 |
| 6 | 001 | 6.00 | 5.47 | 6.25 | 6.36 | 0.100 | 0.080 | | | | 0.9991 | 0.0045 |
| 7 | 000 | 6.50 | 6.50 | — | — | 0.120 | 0.120 | | | | — | — |

FIG. 5B

DYNAMIC APPROXIMATE STORAGE FOR CUSTOM APPLICATIONS

BACKGROUND

Memory and storage often have various tradeoffs between precision (errors), endurance, performance, energy efficiency, and density (capacity). Single-level cell (SLC) memories, such as dynamic random access memory (DRAM) and some forms of Flash, store one bit of data in each cell. To provide higher density, multi-level cell (MLC) memory, such as available with Flash and phase-change memory (PCM), subdivides the range of values in a cell into a larger number of levels to store more than one bit of data. For example, Flash represents values in the threshold voltage of a memory cell and PCM represents values in the resistance of the memory cell. Accordingly, for certain multi-level storage, the larger the resistance range allowed by the cell, the higher the number of levels that can be used in the cell to store information, making the cell denser from a storage perspective. That is, the cell is able to store more information per unit of physical volume. However, with respect to the tradeoffs, there are limitations on how dense a cell can be made while still being cheap and reliable.

In addition, the denser the cell, the more precise the write and read machinery needs to be to preserve the same error rate. For example, for a fixed resistance range, using a higher number of levels requires more precise hardware to write and read these cells correctly every time. More precise hardware means higher costs; and, for the same hardware, storing a higher number of levels in a cell incurs a higher read and write error rate. Other resistance-changing processes such as drift in PCM also affect the read error rate.

BRIEF SUMMARY

Dynamic approximate storage and systems are described herein that enable applications and operating systems to take advantage of relaxing the error requirements of a region in memory of a storage device in exchange for increased capacity, endurance, performance, energy efficiency or other property of the storage device while still being able to maintain suitable output quality for the data.

A memory chip for approximate storage is described that includes at least two regions of memory with different error constraints. The memory chip can include at least one threshold register for storing values for thresholds used to identify a value (or values) for memory cells corresponding to each of the at least two regions; and control logic to programmatically adjust the values for the thresholds for the memory cells. The thresholds can be adjusted to create asymmetric ranges for values in a cell and even adjust the number of levels (and bits) a cell can store.

A method of controlling a storage device for approximate storage includes modifying at least one value stored in a threshold register and associated with at least one cell in a region a memory comprising at least two regions to apply a biasing for the at least one cell, wherein the biasing adjusts ranges for values in a cell. In further implementations, the error rate of a cell or a region of memory can be modified so that the different regions of memory have different levels of error correction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 5A shows Table 1 of uniform (u) and biased (b) 4-level cell parameters.

FIG. 5B shows Table 2 of uniform (u) and biased (b) 8-level cell parameters.

DETAILED DESCRIPTION

Dynamic approximate storage and systems are described herein that enable applications and operating systems to take advantage of relaxing the error requirements of a region in memory of a storage device in exchange for increased capacity, endurance, performance, energy efficiency or other property of the storage device while still being able to maintain suitable output quality for the data.

"Approximate storage" refers to a memory optimization technique where it is possible to indicate that certain objects may be stored in memory having a higher likelihood of errors. These regions of memory having a higher likelihood of errors are not necessarily regions having a high error rate, only that the tolerance or requirement for a particular error rate is relaxed and occasional errors may happen.

"Dynamic approximate storage" involves the adjustable optimization of relaxed error constraints for regions of a storage device. The dynamic approximate storage can involve single-level cell (SLC) and/or variable multi-level cell (MLC) storage, and may further involve error correction techniques. A relaxed error constraint for a memory region may also contribute to additional capacity for storing the data, particularly for applications that do not require, at least for some data, the precision that conventional memory provides.

Dynamic approximate storage is applicable for custom applications that can take advantage of memory with relaxed error constraints. These custom application can include approximation-aware algorithms and/or operating systems. Relaxing the error requirements of a region in memory of a storage device can enable increased capacity, endurance, performance, energy efficiency or other property of the storage device.

The described dynamic approximate storage for custom applications contains distinct regions having different error constraints. The probability of error for a memory region is referred to herein as "precision," where lower probabilities of error represents a higher precision. That is, a higher precision has a lower error rate. Careful matching of cell error properties with types of bits being stored by an application can benefit output quality of that data while getting most of the density benefit that approximate storage offers.

The terms "memory" and "storage" are used interchangeably herein and any specific meaning being applied to the term can be understood by its context.

Figure 1A:
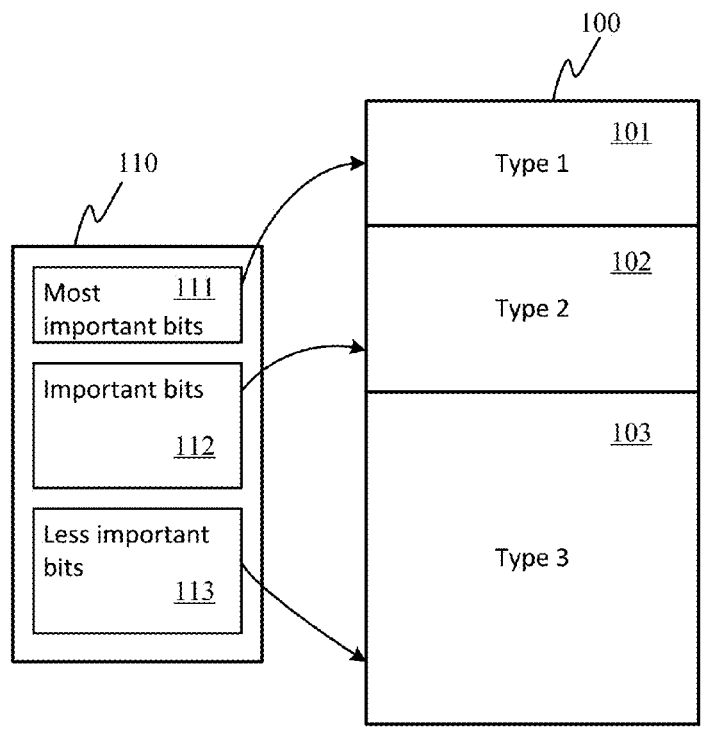
FIG. 1A illustrates operation of storage precision and data encoding.
Figure 1B:
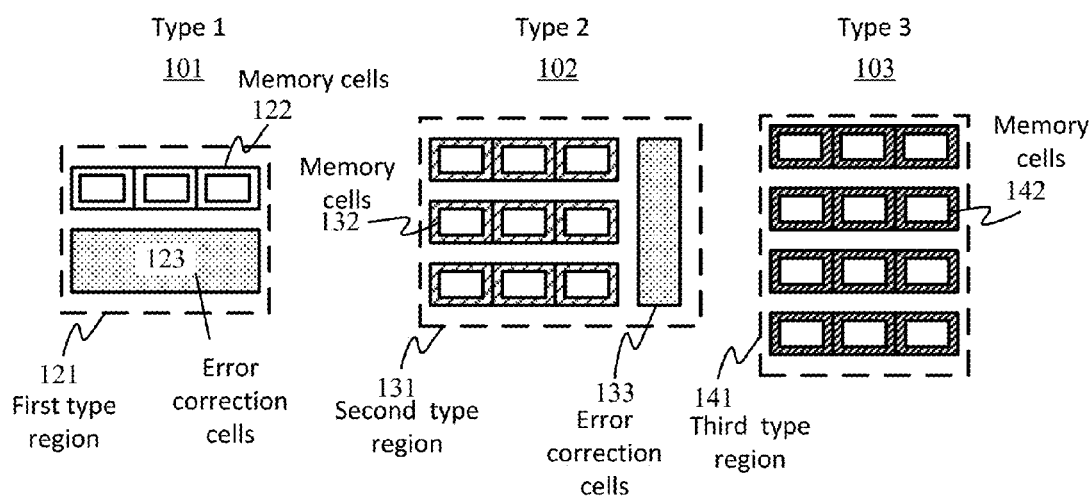
FIG. 1B illustrates a representation of three types of storage regions for the memory 100 shown in FIG. 1A.

FIG. 1A illustrates operation of storage precision and data encoding; and FIG. 1B illustrates a representation of three types of storage regions for the memory 100 shown in FIG. 1A. Referring to FIG. 1A, memory 100 can be assigned multiple regions with different allowed levels of precision (or error rates). For example, a first type region 101 may be the most precise, with the lowest likelihood of errors (e.g., $10^{-12}$ errors); a second type region 102 may be less precise, with a relaxed error rate; and a third type region 103 may be even less precise with a more relaxed error rate. These regions can be hardwired or dynamic (programmed). The difference in error rates may be due to types of error correction applied and/or the density permitted.

Memory 100 may be any suitable memory storage device including SLC memories and MLC memories. For a MLC memory (or a hybrid memory containing SLC and MLC cells), the first type region 101 may be configured as a single level cell region for storing a single bit (even though in the case of the MLC memory it is capable of multiple levels); the second type region 102 may be configured as a denser region, for example, with three or four-level cells; and the third type region 103 may be configured more densely than the second type region 102, for example, with eight-level (e.g., for 3 bits) or denser cells. For various SLC and MLC implementations, the regions may be assigned different types of error correction (e.g., different error codes and/or number of error correction bits). An example of these types of storage regions is shown in FIG. 1B.

In FIG. 1B, three types of storage are shown, representing regions 101, 102, and 103 of FIG. 1A. A first type region 121 with lowest error rates can be optimized for high importance bits 111 to include memory cells 122 and error correction cells 123 providing large error correction overhead. A second type region 131 can be optimized for medium importance bits 112 to include cells 132 that are denser than memory cells 122 with moderate error rates and error correction cells 133 providing some error correction overhead. The third region 141 then includes the cells 142 with the highest allowed error rates (optionally optimized for the lower importance bits 113), for example, being the densest memory and having minimal, if any, error correction.

The inclusion of regions of relaxed error constraints can be identified to programs storing data to the memory 100. Custom applications can then take advantage of the identified precision (as approximation-aware algorithms) and can assign particular data to appropriate regions (e.g., one of regions 101, 102, and 103).

For example, a custom application may generate encoded data 110 that includes bits that can be identified as being most important to output quality (high importance bits 111), bits that can be identified as being important to output quality (medium importance bits 112), and bits that can be identified as being less important to output quality (low importance bits 113). Here, the high importance bits 111 require the highest precision to ensure output quality. Therefore, the high important bits 111 are stored in the first type region 101. An example of high important bits 111 is the header of a block of data. The medium importance bits 112 may be stored in the first type region 101 or it may be sufficient to store the medium importance bits 112 in the second type region 102. The low importance bits 113 can then be stored in the most relaxed error rate region, for example, the third type region 103.

Although three types of regions are shown, in some cases two types of regions may be used; and in some other cases more than three types may be used. The number of types of regions may depend on the particular applications using the memory. In some cases, the number of types are programmable and may be adjusted after manufacturing and even reprogrammed.

The memory cell for each of the regions may be the same type of cell; in such a case, the different regions are obtained by how the values of the cells are interpreted. That is, the reading and writing processes for the multi-level cells can control what type of memory region a cell belongs to. For example, a four-level multi-level cell can be used to store 1 bit or 2 bits by adjusting the thresholds (and even assigning a particular range of resistances).

Figure 2A:
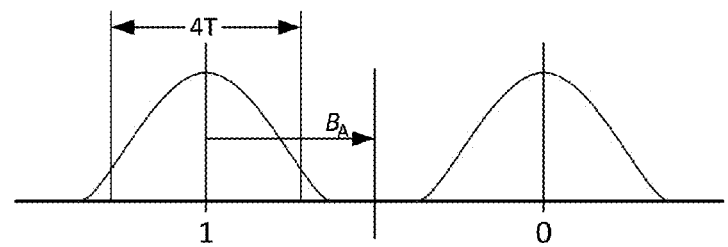
FIGS. 2A-2C illustrate an analog (resistance) range (x axis) for a four level cell with differently assigned thresholds to provide storage of one bit (FIG. 2A) and two bits (FIGS. 2B and 2C).
Figure 2B:
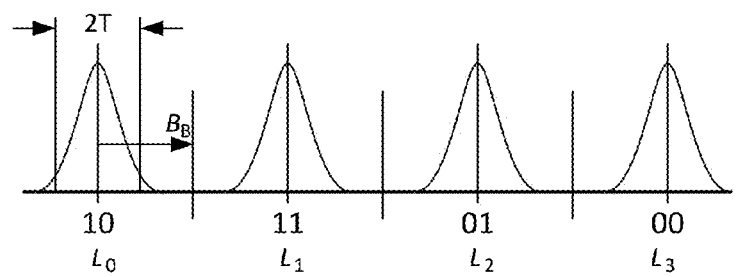
Figure 2C:
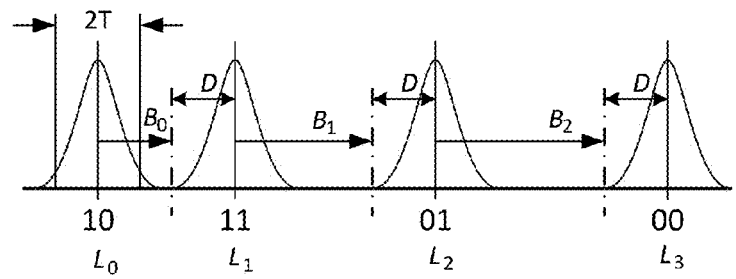

This is illustrated in FIGS. 2A-2C, which shows an analog (resistance) range (x axis) for a four level cell with differently assigned threshold to provide storage of one bit (FIG. 2A) and two bits (FIGS. 2B and 2C). The x-axis range is a log scale.

Phase-change memory cells store information in the resistance of a chalcogenide material, which provides a wide enough range of resistances to allow multi-level cells. The resistance varies based on the amount of amorphous and crystalline material in the cell, which can be controlled by applying current pulses of different amplitude to the material. For SLCs, a single bit of information is stored in either a fully amorphous state (high resistance) or a mostly crystalline state (low resistance). Accordingly, referring to FIG. 2A, the four level cell can be programmed as a two level cell (in a manner of a SLC) by assigning a target threshold for a '1' and a '0'.

The write circuitry for SLCs can be less precise than for MLCs because of the high margins between the high resistance and low resistance levels. Since each MLC level is narrower than the SLC levels, the write circuitry involves more precision and typically employs an iterative process of applying write pulses and subsequently reading the cell to verify the resistance is within the target level boundaries (e.g., 2T). MLCs contain circuitry to map their analog state into digital information. Each range of analog values (a level) maps to a certain binary value (or "bit pattern"). On write operations, the write circuitry iteratively applies pulses and verifies if the target level was reached. In FIGS. 2A-2C, the final write resistance is modeled as a normal distribution around the target resistance of that level.

An example mapping for the 4-level cell is illustrated in FIG. 2B with levels $L_0$, $L_1$, $L_2$, and $L_3$ (in log scale) from lowest to highest resistance having '10' mapped to the lowest resistance band, '11' mapped to the second lowest resistance band, '01' mapped to the second highest resistance band, and '00' mapped to the highest resistance band. Of course, other mappings may be used. Indeed, in some embodiments, it is possible to optimize the mapping of certain bit patterns to particular resistance ranges. For example, data streams indicated as having a high number of '00' patterns can be stored in cells having '00' mapped to a particular part of a range—such as $L_3$ (see FIGS. 2B and 2C), which may have fewer drift errors (as discussed below in more detail).

In some cases, the binary values can be assigned to ranges based on their frequency, where the most common is assigned to the level that fails the least and the second most common to the level with the second to least failure rates and the like. In some cases, the most common is assigned to the level that fails the least, and Gray code is used for the other cells so that values are assigned using a Gray code constraint, but in a manner that minimized aggregate error rate for that type of cell.

For example, if it is determined that '00' is the most common bit pattern, then '10', then '01', and then '11'; and if it is determined that the drift of a multi-level cell occurs as described above (where the highest and lowest levels do not suffer drift, but the second and third do with the third suffering the most), then '00' can be assigned to the fourth level. For the case where Gray code is then used, which is where only one bit changes from level to level, the choice for the bit pattern for the third level is '01' or '10'. Since '01' is less common than '10' and the third level has the worst drift, '01' is assigned to the third level. Next, for the second level, '11' must be selected according to Gray code. Finally, the first level is assigned '10'.

Typically, the partitioning of each resistance range is uniform and each level sits within a target level boundary of 2T (or 4T for the example in FIG. 2A), where more than a B distance (B>T) from a peak of a level's distribution may result in a value indicative of a next level of the cell. A Gray code can be used to minimize the Hamming distance between adjacent levels.

An example of uniform partitioning for PCM is a lowest resistance band $L_0$: $10^3$-$10^4\Omega$, a second lowest resistance band $L_1$: $10^4$-$10^5\Omega$, a second highest resistance band $L_2$: $10^5$-$10^6\Omega$, and a highest resistance band $L_3$: $10^6$-$10^7\Omega$). The write process typically targets the middle of these uniformly partitioned bands (e.g., $10^{3.5}\Omega$, $10^{4.5}\Omega$, $10^{5.5}\Omega$, $10^{6.5}\Omega$, respectively).

A PCM cell can suffer two types of errors—write error and drift error. A write error occurs when the write circuitry is unable to set the cell resistance at the target level before exceeding a maximum number of iterations, leaving the cell in an undesired resistance level. In PCM, material relaxation causes cell resistances to drift to higher resistance levels, resulting in the second type of errors, drift errors. Resistance drift is caused by structural relaxation of the material, which increases resistance over time. The higher the resistance, the stronger the drift. Drift unidirectionally increases the cell resistance and its effect is more significant in higher resistance levels than the lower ones.

The implication is that even if a cell is correctly written originally (within 2T of a resistance range), it may drift over time to a different value, resulting in soft errors (e.g., if an $L_0$ value drifts beyond $L_0$+B). Since $L_3$ is the highest level of the 4-level resistance ranges, drifting to a higher resistance while in $L_3$ does not cause an error. Instead, $L_2$ becomes the level that suffers drift error the most and often dominates in the combined soft error of the cell. As such, the second highest level in a uniform cell ($L_2$ in FIG. 2B) becomes the most drift-prone level and dominates the combined drift error rate. Similar effects are seen in MLCs with more than four levels.

According to certain implementations described herein, errors due to drift (and other susceptibilities) are exposed to applications in a controlled manner using approximate storage. In addition to approximate storage, in some cases, methods for mitigating drift, such as memory scrubbing, error correction, or merging multiple levels to create aggregate levels wide enough to make the level boundary-crossing probability negligible (e.g., Tri-Level Cells) may be included.

Since the size and position of the band in the cells' resistance range determines the number of errors arising from the write process and from drift, it is possible to minimize certain kinds of errors by changing the cell's resistance ranges along with how bits are mapped to cells.

FIG. 2C illustrates an implementation using biasing to minimize drift errors. Instead of the uniform distribution of levels, i.e., where all levels are of the same size (in log space) of FIG. 2B, biased levels, in which the analog value ranges are tuned for minimizing the combined (write and drift) error rate can be implemented. The biased levels present as non-uniform in log space ranges.

For example, in the mapping described above, making the second highest resistance band wider (e.g., $10^5$-$10^{6.5}\Omega$) while still targeting $10^{5.5}\Omega$ during write operations will result in fewer drift errors in PCM.

Biasing repositions and resizes each resistance level as shown in FIG. 2C. The combined drift error rate can be minimized by equalizing the drift error rate of each individual level (assuming the stored data maps to each level uniformly). As shown in FIG. 3C, levels are wider in value ranges where drift is more likely to have an effect, i.e., the higher resistance levels. Level biasing can be optimized based on a fixed elapsed time since the last write ("scrubbing intervals"). This assumes that the system will scrub the storage contents and reset resistance levels to the target resistance at this scrubbing interval. It is worth noting that cells will work at different scrubbing intervals, but they will suffer higher error rates compared to the interval they were optimized for because levels' error rates will not be completely equalized.

The biasing changes the target resistances from being at the center of each level (with equal bands $B_B$) to forming a narrow band at the left (D) and a wider band at the right ($B_t$) to leave more room for drift. However, as the target resistance is moved to lower values and D is reduced, the write error rate begins to increase because the tail of the write resistance distribution gets closer to the lower end of that level. The sizing of D and $B_t$s is therefore a trade-off between write error rate and drift error rate. This relationship and solution can be different for drift in other technologies. For example, some technologies may suffer drift to the lower values in the ranges. Other technologies may suffer drift to the middle values or a particular range of values in the overall range of values. For either of those types of technologies, the biasing can be conducted to form wider bands in the direction where drift may occur.

Accordingly, certain implementations include tuning non-uniform band sizes (e.g., non-uniform ranges in log scale according to the exponents) and write operation targets (to a value possibly different from the middle of a band) to set cell error rates in configurations that may generate less quality degradation in stored images (or any encoded data in general).

In addition or as an alternative, certain implementations include changing how values are mapped to levels, for example, to place more common values (for a particular algorithm) in levels less likely to suffer errors (e.g., into the highest resistance band which has the fewest, if any, errors due to drift). In addition to enabling the storage of 2 bits, the four-level cell can have its particular values be assigned to each target threshold with 2T boundaries in an optimized manner. For example, as shown in FIGS. 2B and 2C, '10' may be mapped to the lowest resistance level while '11' is mapped to the next highest. However, in some other cases, the '11' may be mapped to the lowest resistance level with '10' at the next lowest. The mapping may be assigned based on pattern occurrence. For example, for applications with large numbers of '10' patterns, the '10' can be mapped to the highest resistance level. Another example use of reassigning values to levels is to minimize the number of bits that change in adjacent levels.

Figure 3:
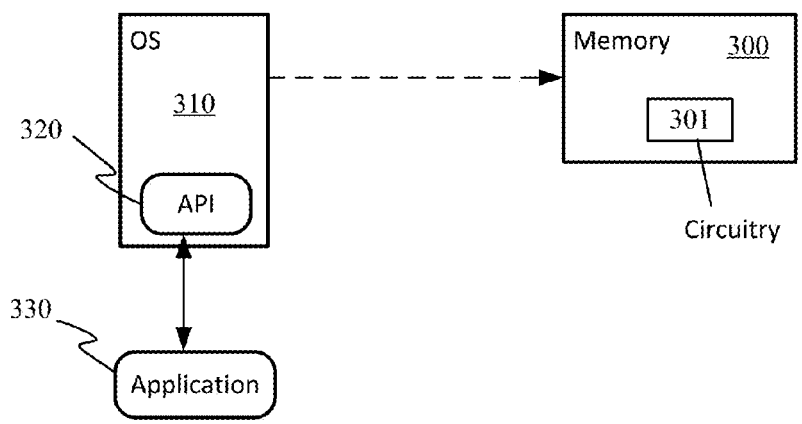
FIG. 3 illustrates a memory system for programmable storage precision.

FIG. 3 illustrates a memory system for programmable storage precision. The memory 300 can implement memory 100 (and any or all of the resistance thresholds illustrated in FIGS. 2A-2C) by including, for example, circuitry 301 for dynamically changing thresholds of multi-level cell storage such as Flash and PCM. Instead of hard coded thresholds that are tuned for generic behavior, the circuitry 301 for dynamically changing thresholds can implement variable threshold. That is, the thresholds indicating levels for a memory cell can be optimized for a particular application (or data type). For example, asymmetric ranges can be established for different values in a cell. PCM uses resistance values; however, other memories can use other physical characteristics including voltage values.

In addition, in some cases, regions can be allocated with particular error codes. In some of such cases the circuitry 301 may be used to implement variable error correction. That is, the error rate of a cell can be modified using different levels of error correction depending on the error constraint for the region to which the cell belongs. The circuitry 301 may be on-chip or part of a memory controller and include registers, decoding logic, and, optionally, logic for external control of data in the registers. A memory controller can contain at least part of the control logic for controlling aspects of the memory; in addition, some control logic may be on the memory itself and other portions of the system.

In some cases, memory 300 is a memory card based on an industry standard, such as a Compact Flash (CF), MultiMediaCard (MMC), or Secure Digital (SD) nonvolatile memory card that is available for use in mobile phones, digital cameras, tablets, phablets, laptops and other computing devices. An SD picture memory (or other data type that is encoded and contains identifiable bits of different error tolerances) implementing the memory 300 includes the circuitry 301 to store programmable thresholds and different mappings based on data attributes (e.g., mappings based on error tolerance and/or bit patterns).

A 32 GB generic SD can function as a picture memory, for example, for 80 GB of data with the inclusion of the circuitry 301 containing registers to store level information (e.g., thresholds for the levels) to enable storage of more error tolerant data bits into denser cells. In some cases, the SD includes logic that allows external control of the values stored in the registers. In some cases, instead of external programmable control of the values stored in the registers, the SD may have hardwired levels/thresholds with different versions for the precisions, which are established at the time of manufacture (or other suitable step in the process).

With an appropriate memory 300, an operating system 310 accessing the memory 300 includes a means to utilize the memory 300. That is, an attribute for the level of precision for data is included so that the operating system 310 can indicate to the memory 300 the level of precision associated with certain bits and/or bytes of data. The indication can include a flag. In some cases, the operating system 310 can receive multiple images (or other data) and send the data identified with the same importance levels into the same type of memory cells by, for example, communicating with a memory controller for the memory 300 to indicate the level of precision for a set of bits or bytes. The example illustrated in FIGS. 1A and 1B shows three levels of precision (and a corresponding three types of regions); however, the granularity may be adjusted so that there are more grades of memory and more grades of the types/importance of bits.

The operating system 310 may include the functionality that identifies data type (and corresponding appropriate level of storage precision) for data being stored. In addition, or as an alternative, the operating system may expose via an application programming interface (API) 320 the different levels of storage precision so that applications 330 can more easily identify to the operating system 310 whether particular data can be stored in memory cells have relaxed requirements.

The application 330 is created or modified to be able assign the relative prioritization of encoded bits of an image (or some other encoded data) into different error susceptibility (and resulting quality-loss) categories. When communicating with the operating system 310 to store the data in the memory 300, the application 330 requests (or indicates) different levels of precision for its data. Whether already understood by the operating system 310 or via the API 320, the operating system 310 and/or memory controller (of memory 300) then maps the bits in the different error susceptibility categories to different cell categories, according to the cells' expected error rates.

Accordingly an operating environment such as illustrated in FIG. 3 can include one or more memory chips (memory 300) that are programmed by the memory controller (or read/write controller) to have thresholds (and/or error codes) optimized for a particular application 330. The assignment of the particular levels of precision can be performed by the system, but be application and/or scenario dependent. For example, an application 330 that stores images of a certain type, for example, JPEG XR, can use memory 300 with thresholds optimized for storing JPEG XR. In some cases, the operating system 310 and/or memory controller can access profiles (stored in precise memory and/or registers) to obtain system parameters based on the type of application storing data. Users may also be able to specify final qualities of their images.

Figure 4A:
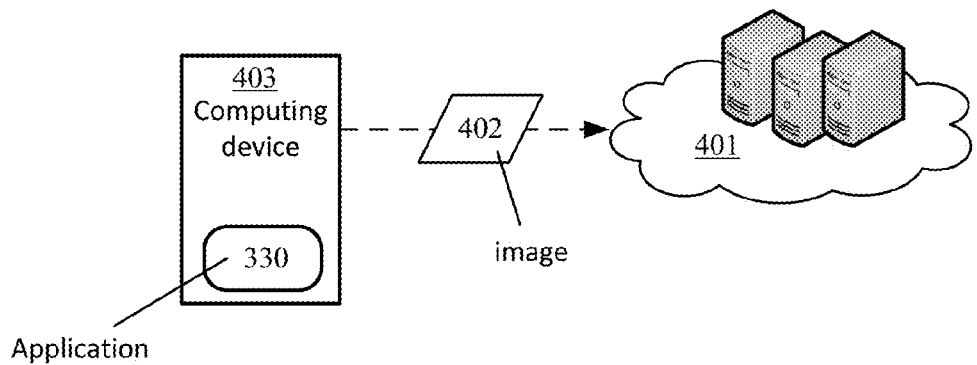
FIGS. 4A-4C illustrate various operating environments and corresponding storage locations.
Figure 4B:
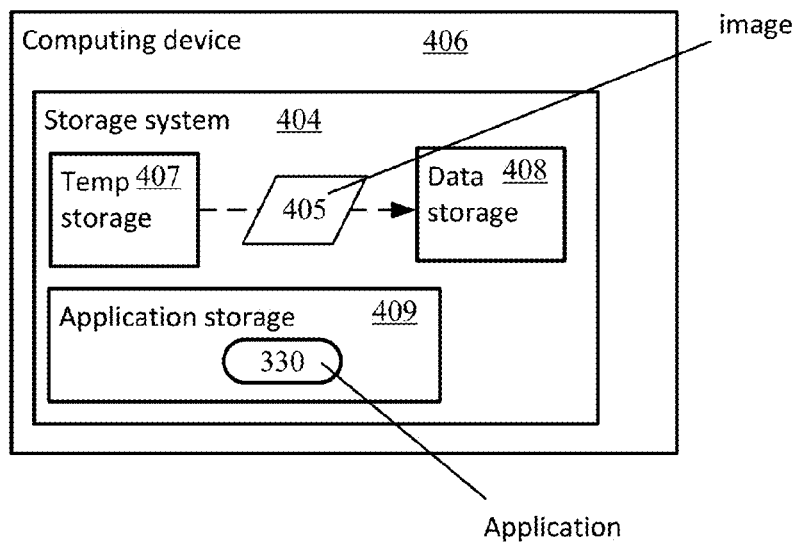
Figure 4C:
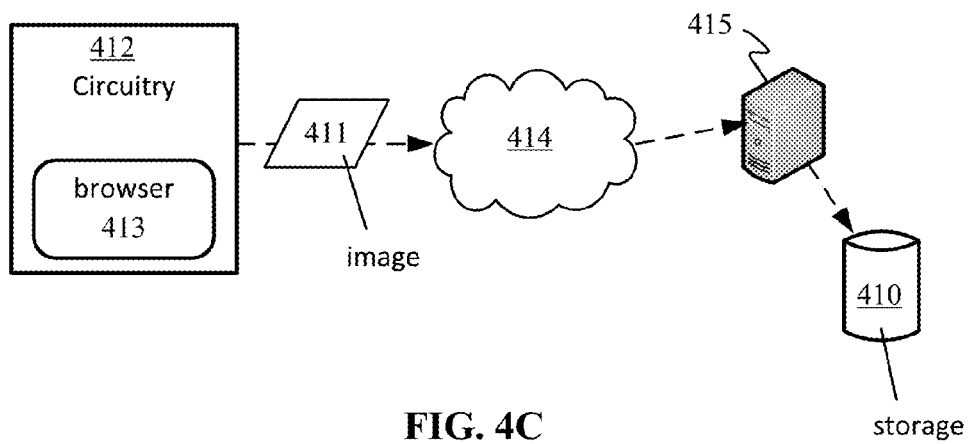

The programmed thresholds may also depend on the location of the storage. FIGS. 4A-4C illustrate various operating environments and corresponding storage locations. For example, as illustrated in FIG. 4A, cloud storage 401 can receive an image 402 from an application 330 executing on a computing device 403. The computing device 403 may be or include one or more of a server, personal computer, mobile device, wearable computer, gaming system, and appliance. One scenario for the operating environment shown in FIG. 4A is a cellphone sending an image 402 to a Microsoft OneDrive® account. The number of programmed thresholds and the particular memory type (e.g., Flash, PCM, etc.) implementing the cloud storage can be selected to be suitable for handling massive amounts of data as common for cloud storage. In one implementation taking advantage of this scenario, the computing device 403 may be a phone that aggressively degrades a copy of the image 402 located on the device the longer the copy has not been accessed. The image 402 may be stored in the cloud storage 401 as a higher quality copy from which the computing device 403 may recover a high quality image.

In the example illustrated in FIG. 4B, the storage 404 receiving the image 405 from the application 330 is a local storage on (or associated with) the device 406 executing the application 330. Continuing with the cellphone example, in this operating environment, the image 405 is stored in the cellphone's memory, for instance by writing the image from temporary storage 407 (such as at the time an image is captured by a camera of the cellphone) to a data storage 408 of the storage 404 of the computing device 406. The application 330 may also be stored in the application storage 409 of storage system 404. In some cases, the data storage 408 and application storage 409 may be part of a same memory chip while the temporary storage 404 is part of a cache that may be separate from or integrated (e.g., on-chip) with a processor of the computing device 406. In some cases, the temporary storage 407 is a region on a same chip as the data storage 408. Of course, the particular configuration is device and technology dependent.

As previously noted, the particular number of programmed thresholds can be based on the capabilities and storage needs of the device 406, which may be one or more of a server, personal computer, mobile device, wearable computer, gaming system, and appliance. In the cellphone example, 20% of the storage 404 may be allocated for the most precise region of memory so that there is sufficient space for application storage 404 and important data; whereas the remaining storage 404 can have higher allowed error rates (e.g., by being more dense or having less bits for error correction).

In the example illustrated in FIG. 4C, the storage 410 can be associated with a website that receives an uploaded image 411 from a computing device 412 (via web browser 413) over the Internet 414 (and stores the image at a server 415 with associated storage 410). Although shown in a separate representation, the example illustrated in FIG. 4C may be carried out in the environment illustrated in FIG. 4A. For example, the website may be hosted by a cloud service and/or the associated storage may be cloud storage. In other cases, designated servers are used to host the website and store associated data. The needs and capabilities of these devices can influence the number of thresholds and the allocation of the amount of storage available at each threshold.

Storage Substrate Optimization

A PCM storage substrate can be optimized to offer high density, yet reasonable error rates via biasing and very low frequency scrubbing. In the example study, a PCM storage substrate was optimized to minimize errors via biasing and tuned via selective error correction to different error rate levels. This optimization was performed for a particular image encryption algorithm, an approximation aware progressive transform codec (PTC).

In the optimization, the mapping of cell resistance levels to their digital values were adjusted to perform biasing to optimize the PCM cells to balance write errors with drift errors and then the optimized cells were tuned with selective error correction to match the bits encoded by the PTC that these cells are expected to store. For example, a multi-level PCM cell design can be optimized for high density (e.g., 3×) at reasonably high error rates (e.g., $10^{-3}$).

The described optimization achieves low error rates in a 4-level configuration (2 bits/cell) and reasonably low error rates in an 8-level configuration (3 bits/cell).

For optimization, a PCM cell's resistance range is partitioned into biased levels. Once the resistance range is partitioned into biased levels, the next step is to map digital values to individual biased levels. Both in general and in the PTC encoded images, zeroes are the most common ('00' for 4-level cells and '000' for 8-level cells), so the value zero is mapped to the highest level, which is immune to drift. There was no other value that appeared to be more common than others for images, so the values for the remaining levels were assigned by using a simple Gray code.

In a preferred implementation for the case study embodiment, three cell configurations are used: a precise configuration, a 4-level configuration and an 8-level configuration. Neither the 4-level nor the 8-level configuration achieves the published uncorrectable bit error rate of solid-state storage products ($10^{-16}$) in their raw form, but can achieve reasonably low error rates that can be error-corrected to the commercial reliability level. Even for 8-level cells, which have higher error rates, the storage overhead of error correction is lower than 100%, so even with this overhead, biased 8-level cells provide denser storage when compared to the uncorrected biased 4-level cells.

Unfortunately, even after biasing, using the modeled circuitry for 16-level cells resulted in error rates that were too high (write error rates are reasonable around $10^4$, but the drift error rate is unbearably high $-10^1$ after 1 second of write operation) and cannot be brought down to reasonable rates by error correction with storage overhead low enough to justify the increase in number of levels. The 2-level and 3-level cells were used as precise baselines since they show very low error rates. On the one hand, 2-level cells are simpler and faster. On the other hand, 3-level cells offer higher density at still low enough error rates to be considered precise. The 4-level and 8-level cells were then used as approximate memory cells.

Even after biasing, drift may still be an issue in the long-term. To mitigate excessive drift, scrubbing can be used to rewrite the cell and bring the resistance level back down. Based on the PCM cell model (described in more detail below), the scrubbing period was expected to be on the order of 3 months ($10^7$ seconds). The average access bandwidth on the order of 100 bits/second per gigabit of storage is a negligible figure. Also, if data is going to be scrubbed anyways, this may be a good opportunity to also perform wear leveling.

Once cells are optimized, the cells can be tuned to provide different error rate levels. The storage controller is responsible for offering a variety of error correction codes, each at a different point in the space defined by the storage overhead required for metadata storage and the error rate reduction provided. In principle this results in higher controller complexity, but in practice using multiple codes in the same family (e.g., BCH-4 and BCH-16) may keep complexity under control.

The controller is also responsible for organizing the storage into regions, each with a different error correction strength. The controller stores a region-to-configuration map in a table resident in the controller and backed by a preconfigured precise region of storage that persists the map during power cycles. System software sends special configuration commands to the controller to allocate and configure regions. Once configured, the controller uses the requested address and the information in the region-to-configuration map to determine which region the request targets and the appropriate error correction strength to use in servicing the request. The number of different regions is small (e.g., 8 in this example), so the region-to-configuration map can support variable-size regions and be fully associative.

Regions with different error correction have different metadata overhead. As such, different regions will need different number of cells to store the same number of data bits. The entire storage space may be managed in one of two ways. Static management simply partitions the storage into multiple regions at manufacturing time. This approach is inflexible in that it does not allow a different proportion of storage to be dedicated to a region. The second approach is to allow dynamic reconfiguration of regions to match application demands. In this case, region resizing causes additional complexity. Assuming the storage device leaves manufacturing with all regions initialized to the strongest available error correction by default, when a region is configured of the first time, it grows in density, and thus in usable size. A simple way to cope with this is to expose this region as two regions, one of the original size before reconfiguration, and a virtual one with the surplus storage. This makes addressing simpler. A region can only be reconfigured to a smaller size if the system can accommodate the contents of the surplus region elsewhere.

Evaluation Setup

A custom simulation infrastructure was used for the multi-level cell simulations. The quality measurements were based on 24 grayscale raw images at 768×512 pixels resolution in the Kodak PCD image set. Configurations and parameter settings for 4-level cells and 8-level cells are summarized in FIGS. 5A and 5B, respectively. FIG. 5A shows Table 1 of uniform (u) and biased (b) 4-level cell parameters. $R_T$ denotes the mean resistance of a level, and $R_B$ denotes the resistance at the upper boundary of the level. FIG. 5B shows Table 2 of uniform (u) and biased (b) 8-level cell parameters. Note that, compared to uniform cells, biased cells have target levels (log $R_T$) and the level boundaries (log $R_B$) move toward lower resistances by appropriate amounts, resulting in lower drift-induced errors at the cost of increased write errors. The write error rate of biased cells was set to the order of $10^{-6}$ according to the application's characteristics. The overall drift error rate can be minimized by equalizing the drift error rates for all the levels (except for the first level and the last level). Cells are optimized for a scrubbing interval $t=10^7$s (about 3 months) after they are written. During scrubbing, their original target resistance is restored.

The proposed system was evaluated by two metrics: peak signal to noise ratio (PSNR) and memory density. PSNR compares the original image, pixel by pixel, with the decoded image that contains errors from lossy compression algorithm (e.g., quantization) and memory subsystem (in this case, uncorrected write errors and drift errors). The higher the PSNR value, the smaller the difference between the original and the reconstructed images.

The approximate memory system was evaluated with images from several target PSNR levels, i.e., 35 dB, 38 dB, 40 dB, and 42 dB. For most images, 40-42 dB range denotes high image quality, with distortion nearly imperceptible visually; whereas, 38 dB and 35 dB represent mediocre and low quality, respectively. Due to the nondeterministic error patterns in the approximate memory system, 100 samples of each image were run in the benchmark and the minimum PSNR was used, which gives a lower bound on the quality of the reconstructed image. Memory density is defined as the number of data bits stored by a cell. Error-prone memories (e.g., PCM) commonly use error correction codes (ECC) to recover from certain number of errors. The storage overhead of error correction bits may degrade memory density.

Figure 6:
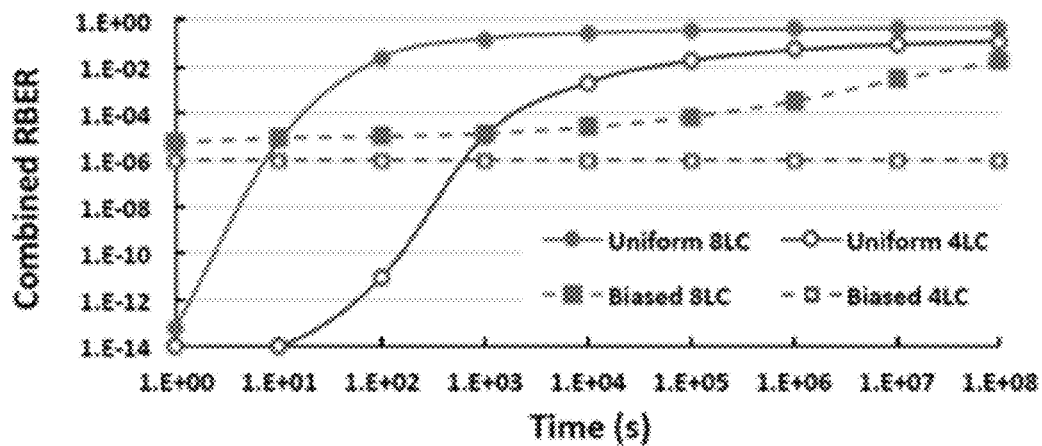
FIG. 6 shows a plot of combined raw bit error rates (RBERs) over time of uniform and biased PCM cells.

For a custom application for which target error rates for error tolerance classes have been determined, the PCM substrate can be optimized for the custom application. In the example case study, the substrate is optimized for an arbitrary scrub rate ($10^7$s, or approximately 3 months) by optimizing cells via biasing. FIG. 6 shows a plot of combined raw bit error rates (RBERs) over time of uniform and biased PCM cells. Here, the effect of biasing on error rates, for both 4-level and 8-level cells, is illustrated, reporting combined error rates across all levels. Error rates grow over time because of drift effects.

Initially, 4-level and 8-level uniform cells (Uniform 4LC and Uniform 8LC) are used. As expected, error rates for 4-level cells are always lower than for 8-level cells because fewer levels allow more room for drift in each level. However, both types of cells start showing excessively high error rates even only an hour after being written. In contrast, Biased 4LC maintains very low drift error rates during the range of time ($10^{-20}$ at $10^{10}$s). The raw bit error rate (RBER) of the Biased 4LC is dominated by the write errors. Biased 8LC, which combines highest density with reasonably low error rates, provides a good trade-off with error rate of about $10^{-3}$, two orders of magnitude lower than Uniform 8LC at $10^7$s. Luckily, it also matches the needs of the most error tolerant bits (i.e., the refinement bits). This allows no error correction to be used at all for these bits, eliminating unnecessary metadata overhead.

Figure 7:
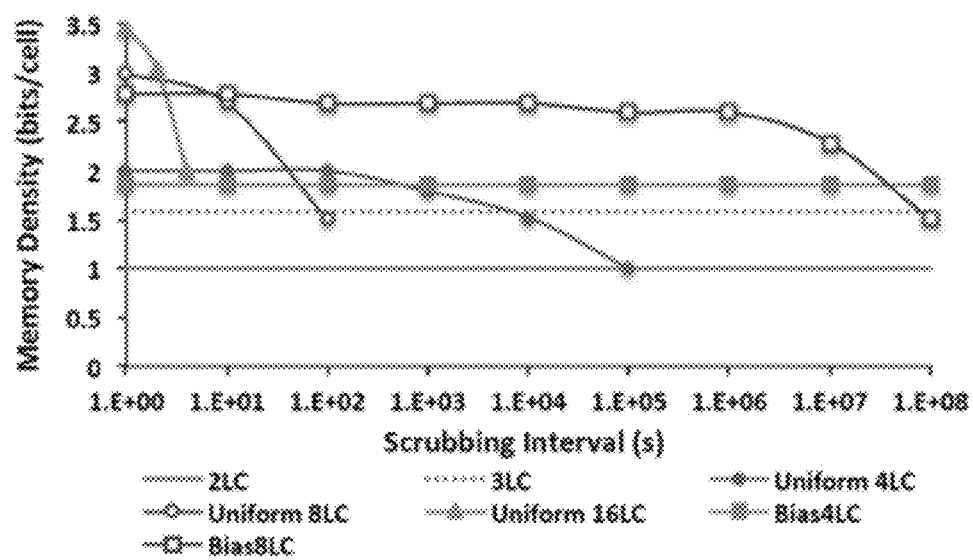
FIG. 7 shows a plot of density with increasing scrubbing intervals comparing uniform and biased PCM cells.

FIG. 7 shows a plot of density with increasing scrubbing intervals comparing uniform and biased PCM cells. FIG. 7 provides insight on which cell configuration offers the best trade-off between overall density for the example implementation, including error correction to maintain uncorrectable bit error rate (UBER) at commercial rates ($10^{-16}$), and scrubbing overhead. 2LC and 3LC cells have RBERs as low as precise memory, and hence do not require error correction. 3LC provides 1.58× higher density over 2LC. The densities of uniform cells (i.e., 4LC, 8LC, and 16LC), although high for short scrubbing intervals (so short they are unattractive), fall sharply at longer intervals, since drift-induced errors accrue fast. In contrast, biasing suppresses the growth of drift error rates significantly: Bias4LC has stable 1.86× density gains (due to write errors), and Bias8LC experiences a much smoother density degradation, achieving 2.28× density improvement after about 3 months ($10^7$s).

Figure 8:
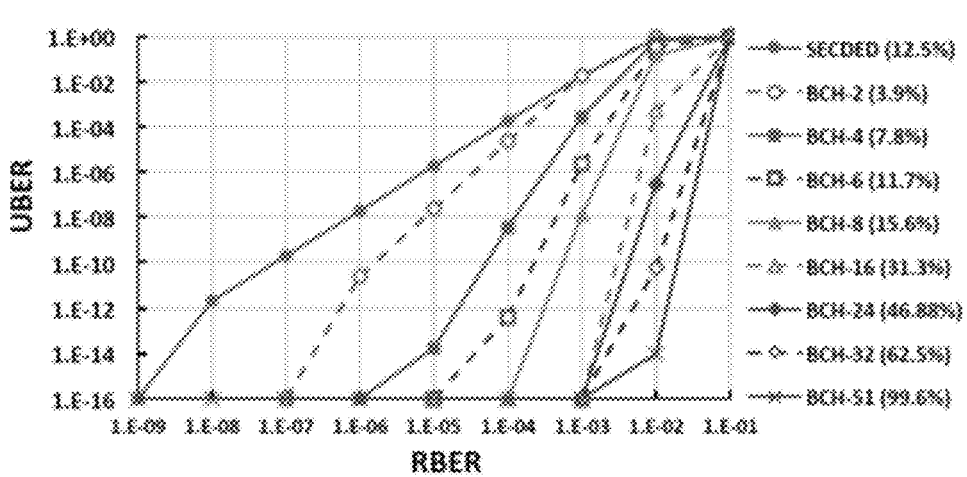
FIG. 8 shows a plot comparing capabilities and overheads of error correction codes (ECC) at 512 data bit blocks.

Once both the algorithmic error rate requirements for a custom application are determined and the substrate is optimized for lowest possible error rates, the algorithm and substrate can be matched via error correction. This relies on understanding the trade-offs between storage overhead of the error correction mechanism and its correcting power. FIG. 8 shows a plot comparing capabilities and overheads of error correction codes (ECC) at 512 data bit blocks. In FIG. 8, a variety of error correction mechanisms (with storage overheads), and the correspondence between raw bit error rates (RBER) and uncorrectable bit error rates (UBER) are provided.

Single error correcting and double-error detecting (SECDED) ECC corrects one error and detects up to two errors in 72 bits; each of the BCH codes corrects up to the denoted number of errors in 512 data bits plus overhead. The appropriate error correction technique can be selected for a memory region based on the needs/error constraints of a particular class of bits of the custom application. In some cases, additional error correction may not be needed. In other cases, some additional error correction scheme is used. For example, if a correction mechanism is desired that accepts a RBER of $10^{-3}$ and produces a UBER of $10^{-16}$, the plot shows that BCH-16 is the code that provides this capability with the lowest storage overhead (31.3%). Similarly, it can be seen that BCH-6 provides a $10^{-6}$ UBER at an overhead of 11.7%, which can be sufficient for certain low importance bits (that may make up a majority of the bits being stored).

It is also worth noting that as RBER increases, the code strength required to maintain the same UBER grows rapidly. This highlights the value of biasing: had it not lowered the error rate by two orders of magnitude, the 8-level cell design would have offered RBER so high that the overhead of correcting all errors would have made it prohibitive.

The scrubbing period chosen for the biasing optimization was somewhat arbitrary. To illustrate the effects of using the same described cell design with other scrubbing intervals (so the cells are used "out-of-spec" for different scrubbing intervals), simulations were performed over the different scrubbing intervals. If the interval is shorter than specified, write errors dominate; if the interval is longer, drift errors dominate instead.

Figure 9:
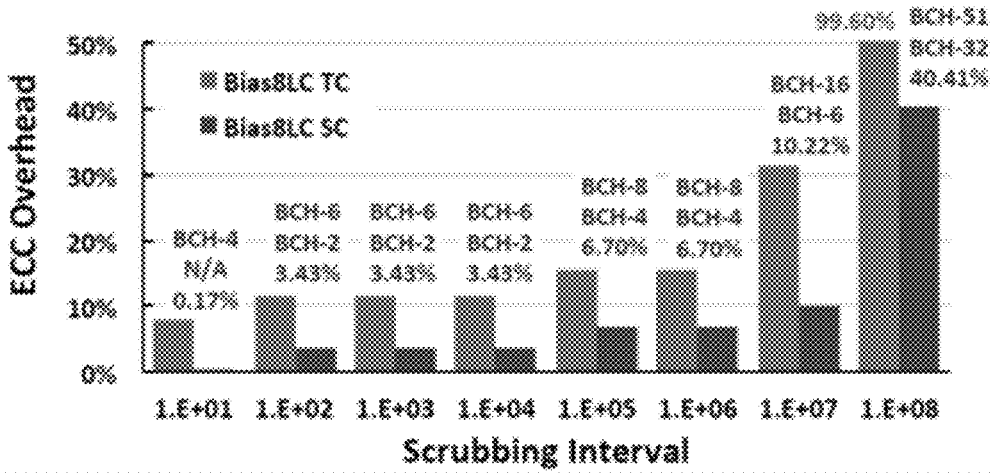
FIG. 9 shows a graph illustrating the trade-off between ECC storage overhead and scrubbing interval.

FIG. 9 shows a graph illustrating the trade-off between ECC storage overhead and scrubbing interval. For each column, the code in the first row is applied to all the bits in thorough correction (TC); the selective correction (SC) uses the first-row ECC for the control and run-length bits in MB1, and the second-row ECC for the control and run-length bits in other MBs, and leaves all refinement bits unprotected. The third row shows the total overhead for SC. In FIG. 9, it can be seen how error correction selection would have changed for different scrubbing intervals (assuming <1 dB quality degradation).

The graph in FIG. 9 compares thorough correction (Bias8LC TC) with selective correction (Bias8LC SC) side-by-side at each interval. As the scrubbing interval increases (towards the right of x-axis), stronger ECC mechanisms must be employed to suppress the growth of drift error rate, resulting in higher storage overheads. On the other hand, larger intervals reduce system energy and bandwidth overheads due to data movement and checker bits computation generated by the scrubbing.

Although $10^7$ seconds was selected as the target scrubbing interval for the dense, approximate image storage system, shorter intervals might also be acceptable for other systems if higher density is the top priority. The main takeaway from these results, however, is that selectively applying error correction only where needed can significantly reduce the loss in density while bringing the memory to the algorithmically-required error rates, as evidenced by the large difference in each pair of bars. By including the biasing (optimized at the scrubbing interval of $10^7$s), only 10.22% storage overhead (brought down from almost 32%) is required, resulting in being able to reach storage density 2.73× over the 2-level baseline.

Figure 10:
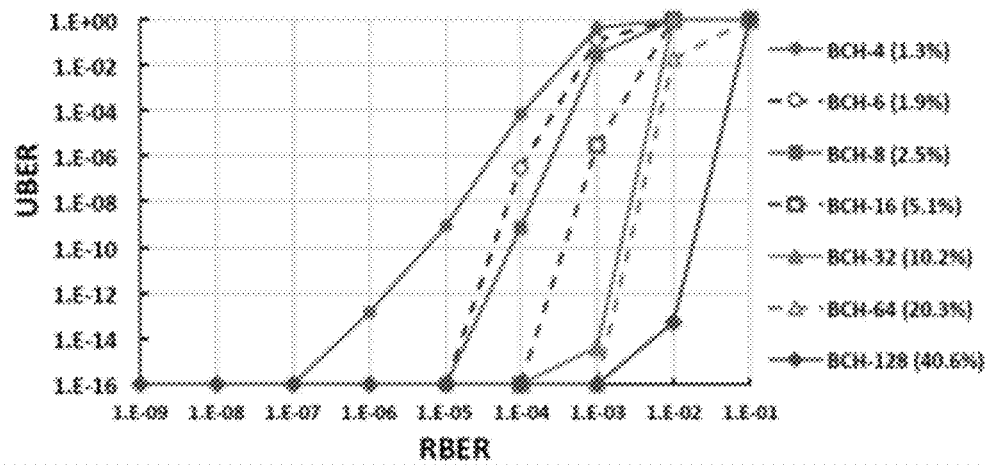
FIG. 10 shows a plot comparing capabilities and overheads of ECC at 512 byte block data for Flash.

The framework described herein is readily applicable to other technologies, e.g., Flash, particularly multi-level Flash (e.g., TLC NAND Flash). In such devices, ECCs (BCH and LDPC are common) are applied to a sector of 512 bytes (or greater, such as 1024 bytes). FIG. 10 shows a plot comparing capabilities and storage overheads of ECC at 512 byte block data (typical of Flash). Each code is able to correct the denoted number of errors in a 512 Byte Flash sector and the augmented ECC checker bits.

Prior studies report that TLC NAND Flash devices have an initial RBER of $10^{-4}$, which increases gradually with the number of program/erase cycles. Accordingly, a TLC Flash could use BCH-16 for the cells storing the bits needing the highest precision, BCH-6 for bits needing less precision, and remaining bits needing the lowest precision could be uncorrected. RBER increases along with program/erase cycles, so stronger ECCs are gradually required. For instance, RBER reaches $10^{-3}$ after approximately 3000 program/erase cycles. At this point, the density improvement of selective correction and thorough correction lower to 2.88× and 2.49×, respectively, making selective correction more attractive.

Co-designed data encoding and storage mechanisms provide denser approximate storage. By identifying the relative importance of encoded bits on output quality and performing error correction according to the identified relative importance, it is possible to increase storage capacity. Level biasing can further be incorporated into storage to reduce error rates in substrates subject to drift. Advantageously, the described systems and techniques are applicable to a variety of storage substrates.

Certain aspects of the invention provide the following non-limiting embodiments:

Example 1

A memory chip for dynamic approximate storage, comprising: an array of memory cells, the array comprising at least two regions; at least one threshold register for storing values for thresholds for memory cells corresponding to each of the at least two regions; and control logic to programmatically adjust the values for the thresholds for the memory cells.

Example 2

The memory chip of example 1, wherein the values for thresholds represent resistance thresholds.

Example 3

The memory chip of example 2, wherein the resistance thresholds for the memory cells for at least one of the at least two regions indicate non-uniform in log scale resistance bands.

Example 4

The memory chip of example 1, wherein the values for thresholds represent voltage thresholds.

Example 5

The memory chip of any of examples 1-4, wherein the memory cells comprise at least one of a single level cell or a multi-level cell, wherein the at least two regions have a corresponding at least two types of available error correction overhead.

Example 6

The memory chip of any of examples 1-5, further comprising a controller providing a variety of error correction codes, wherein the controller stores a region-to-configuration map to indicate an appropriate region of the at least two regions to which a request targets and an appropriate error correction strength from one of the variety of error correction codes to service the request.

Example 7

The memory chip of any of examples 1-6, further comprising at least one bit pattern mapping register for storing a bit pattern table that maps a particular bit pattern to a particular level in a multilevel cell of at least one of the regions of the at least two regions, wherein the control logic further comprises control logic to programmatically assign the particular bit pattern being mapped to the particular level.

Example 8

The memory chip of any of examples 1-7, wherein the memory chip is a secure digital (SD) nonvolatile memory card.

Example 9

A method of controlling a storage device for dynamic approximate storage, comprising: modifying at least one value stored in a threshold register and associated with at least one cell in a region of a memory comprising at least two regions to apply a biasing for the at least one cell, wherein the biasing adjusts ranges for values in a cell.

Example 10

The method of example 9, further comprising: assigning a bit pattern to each of the ranges for the values in the cell.

Example 11

The method of example 9 or 10, further comprising: assigning a first level of error correction to one of the at least two regions and assigning a second level of error correction to a second of the at least to regions.

Example 12

The method of any of examples 9-11, wherein the biasing generates non-uniform in log scale ranges.

Example 13

The method of any of examples 9-12, wherein the memory is a phase change memory and the values represent resistance values.

Example 14

The method of any of examples 9-12, wherein the values represent voltage values.

Example 15

The method of example 14, wherein the memory is a multi-level Flash memory.

Example 16

A mobile device comprising: a processor; a storage system comprising: a memory chip comprising an array of memory cells, the array comprising at least two regions; at least one threshold register for storing values for thresholds for memory cells corresponding to each of the at least two regions; and control logic to programmatically adjust the values for the thresholds for the memory cells; and a custom application stored on the storage system and comprising instructions that when executed by the processor store data on the memory chip, wherein the data has bits identified with at least two types of error constraints.

Example 17

The mobile device of example 16, wherein the thresholds for the memory cells for at least one of the at least two regions indicate non-uniform in log scale ranges.

Example 18

The mobile device of example 16 or 17, further comprising a controller providing a variety of error correction codes.

Example 19

The mobile device of example 18, wherein the controller stores a region-to-configuration map to indicate an appropriate region of the at least two regions to which a request to store the data targets and an appropriate error correction strength from one of the variety of error correction codes to service the request.

Example 20

The mobile device of any of examples 16-19, further comprising at least one bit pattern mapping register for storing a bit pattern table that maps a particular bit pattern to a particular level in a multilevel cell of at least one of the regions of the at least two regions, wherein the control logic further comprises control logic to programmatically assign the particular bit pattern being mapped to the particular level.

Example 21

The mobile device of any of examples 16-19, wherein the values for thresholds represent resistance thresholds.

Example 22

The mobile device of any of examples 16-19, wherein the values for thresholds represent voltage thresholds.

Example 23

A system or product for performing the method of any of examples 9-15.

Example 24

A system comprising means for modifying at least one value stored in a threshold register and associated with at least one cell in a region of a memory comprising at least two regions to apply a biasing for the at least one cell, wherein the biasing adjusts ranges for values in a cell.

It should be understood that the examples and embodiments described herein are for illustrative purposes only and that various modifications or changes in light thereof will be suggested to persons skilled in the art and are to be included within the spirit and purview of this application.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A memory chip for dynamic approximate storage, comprising:
   an array of memory cells, the array comprising at least two regions;
   at least one threshold register for storing values for thresholds for memory cells corresponding to each of the at least two regions; and
   control logic that communicates with the at least one threshold register to programmatically adjust the values for the thresholds for the memory cells,
   wherein the programmatic adjustments are based on data attributes, which include a level of precision associated with certain data, such that partitions defining a bit level or bit pattern are configured for the memory cells of the at least two regions.

2. The memory chip of claim 1, wherein the values for thresholds represent resistance thresholds.

3. The memory chip of claim 2, wherein the resistance thresholds for the memory cells for at least one of the at least two regions indicate non-uniform in log scale resistance bands.

4. The memory chip of claim 1, wherein the values for thresholds represent voltage thresholds.

5. The memory chip of claim 1, wherein the memory cells comprise at least one of a single level cell or a multi-level cell, wherein the at least two regions have a corresponding at least two types of available error correction overhead.

6. The memory chip of claim 1, further comprising a controller providing a variety of error correction codes, wherein the controller stores a region-to-configuration map to indicate an appropriate region of the at least two regions to which a request targets and an appropriate error correction strength from one of the variety of error correction codes to service the request.

7. The memory chip of claim 1, further comprising at least one bit pattern mapping register for storing a bit pattern table that maps a particular bit pattern to a particular level in a multilevel cell of at least one of the regions of the at least two regions, wherein the control logic further comprises control logic to programmatically assign the particular bit pattern being mapped to the particular level.

8. The memory chip of claim 1, wherein the memory chip is a secure digital (SD) nonvolatile memory card.

9. A method of controlling a storage device for dynamic approximate storage, comprising:
   modifying at least one value stored in a threshold register and associated with at least one cell in a region of a memory comprising at least two regions to apply a biasing for the at least one cell,
   wherein the biasing adjusts ranges for values in a cell based on an attribute for a level of precision for data being stored in the cell,
   wherein the ranges for the values in the cell represent partitions defining a bit level or bit pattern.

10. The method of claim 9, further comprising:
    assigning a bit pattern to each of the ranges for the values in the cell.

11. The method of claim 9, further comprising:
    assigning a first level of error correction to one of the at least two regions and assigning a second level of error correction to a second of the at least to regions.

12. The method of claim 9, wherein the biasing generates non-uniform in log scale ranges.

13. The method of claim 9, wherein the memory is a phase change memory and the values represent resistance values.

14. The method of claim 9, wherein the values represent voltage values.

15. A mobile device comprising:
    a processor;
    a storage system comprising:
    a memory chip comprising an array of memory cells, the array comprising at least two regions; at least one threshold register for storing values for thresholds for memory cells corresponding to each of the at least two regions; and control logic that communicates with the at least one threshold register to programmatically adjust the values for the thresholds for the memory cells, wherein the programmatic adjustments are based on data attributes, which include a level of precision associated with certain data, such that partitions defining a bit level or bit pattern are configured for the memory cells of the at least two regions; and
    a custom application stored on the storage system and comprising instructions that when executed by the processor store data on the memory chip, wherein the data has bits identified with at least two types of error constraints.

16. The mobile device of claim 15, wherein the thresholds for the memory cells for at least one of the at least two regions indicate non-uniform in log scale ranges.

17. The mobile device of claim 15, further comprising a controller providing a variety of error correction codes.

18. The mobile device of claim 17, wherein the controller stores a region-to-configuration map to indicate an appropriate region of the at least two regions to which a request to store the data targets and an appropriate error correction strength from one of the variety of error correction codes to service the request.

19. The mobile device of claim 15, further comprising at least one bit pattern mapping register for storing a bit pattern table that maps a particular bit pattern to a particular level in a multilevel cell of at least one of the regions of the at least two regions, wherein the control logic further comprises control logic to programmatically assign the particular bit pattern being mapped to the particular level.

20. The mobile device of claim 15, wherein the values for thresholds represent resistance thresholds.

* * * * *